(12) United States Patent
Sanzo et al.

(10) Patent No.: US 6,566,905 B2
(45) Date of Patent: May 20, 2003

(54) METHOD AND APPARATUS FOR A MULTI-STATE SINGLE PROGRAM PIN

(75) Inventors: Christopher J. Sanzo, Providence, RI (US); Claudio Tuozzolo, Johnston, RI (US)

(73) Assignee: Sipex Corporation, Billerica, MA (US)

(*) Notice: Subject to any disclaimer, the term of this patent is extended or adjusted under 35 U.S.C. 154(b) by 0 days.

(21) Appl. No.: 09/896,550

(22) Filed: Jun. 29, 2001

(65) Prior Publication Data

US 2002/0021156 A1 Feb. 21, 2002

Related U.S. Application Data

(60) Provisional application No. 60/217,949, filed on Jul. 13, 2000.

(51) Int. Cl.$^7$ ............................................... H03K 19/00
(52) U.S. Cl. ........................... 326/37; 326/16; 326/38; 716/8; 716/16; 716/17
(58) Field of Search ..................... 326/37–41; 716/8, 716/16, 17; 327/538

(56) References Cited

U.S. PATENT DOCUMENTS 4,250,407 A    2/1981  Dorey et al. ............... 307/209
5,581,747 A  * 12/1996 Anderson .................... 395/551
6,229,385 B1   5/2001  Bell et al. .................... 327/565
6,286,127 B1 *  9/2001 King et al. ..................... 716/8

OTHER PUBLICATIONS

Maxim, "Miniature, Low Voltage, Precision Step Down Controller," Feb. 1998, pp. 1–20.
Texas Instruments, "UCC29421, UCC29422, UCC39421, UCC39422 Multimode High–Frequency PWM Controller," Oct. 1999—Revised Apr. 2000, pp. 1–32.

* cited by examiner

Primary Examiner—Michael Tokar
Assistant Examiner—Vibol Tan

(57) ABSTRACT

In one aspect the invention relates to a method of selecting a state from a plurality of states using a program pin. The method includes connecting the program pin to one of a first current source and a second current source, in response to a first voltage applied to the program pin, to thereby generate a second voltage at the program pin, and selecting a state from the plurality of states in response to the first and second voltages. In another embodiment, the method includes determining whether the first voltage exceeds a first reference voltage. In another embodiment, the method includes connecting the program pin to the first current source if the first voltage does not exceed the first reference voltage, and connecting the program pin to the second current source if the first voltage exceeds the first reference voltage.

30 Claims, 7 Drawing Sheets

US 6,566,905 B2

METHOD AND APPARATUS FOR A MULTI-STATE SINGLE PROGRAM PIN

CROSS-REFERENCE TO RELATED APPLICATIONS

This application claims priority to U.S. provisional application Ser. No. 60/217,949, filed Jul. 13, 2000.

FIELD OF THE INVENTION

This invention relates generally to the field of integrated circuits. More specifically, the invention relates to a method and apparatus for selecting a state and an option within the selected state using a single program pin.

BACKGROUND OF THE INVENTION

An integrated circuit ("IC") can require input from a user to determine a state of operation or to enable/disable certain features of the integrated circuit. One technique to provide input to the integrated circuit is to use a digital word and provide an external pin for each bit of the digital word. For example, for a two-bit digital word providing four possible states, the IC includes two external pins. Each pin is coupled to a logic high voltage rail (e.g., +3.3. volts, +5 volts) or a logic low voltage rail (e.g., 0 volts, ground reference) to create the digital word corresponding with the desired state. One disadvantage is that the more states the integrated circuit has, the more external pins are needed to implement user selectability. Another technique is to receive the data word serially through a single pin. The problem with this technique is that the integrated circuit must contain complex decoding circuitry and timing information to decode the serial word. Yet another technique is to use an A/D converter to convert various voltages applied to the single pin to various states which correspond to the applied voltages. This technique requires a precise voltage supply external to the integrated circuit to ensure an accurate conversion. Another technique is to use a single pin connected to a timed, sample circuit within the integrated circuit, as shown in U.S. Pat. No. 6,229,385 to Bell et al. This technique uses a single pin for multiple purposes, sampling the pin at certain time intervals to receive state data. In addition to the complex circuitry needed inside the integrated circuit for the sample circuit, this technique also requires a timing circuit to control when the sample circuit reads the control signal. Another technique is to use a single pin connected to a group of specially arranged transistors within the integrated circuit, as shown in U.S. Pat. No. 4,250,407 to Dorey et al. This technique uses an external voltage placed at a point within a "step-ladder" of transistor turn-on voltages to bias a specific number of transistors according to the desired state. The disadvantages with this technique is that the configuration of transistors only allows a predefined set of discrete states that fall within the bias range of the transistor bases and thus doesn't allow continuous options within a state. The present invention addresses the shortcomings of the above techniques.

SUMMARY OF THE INVENTION

It is therefore an object of this invention to use a single pin connected to a connecting element (e.g., any element that allows current flow, such as a wire, a resistor or the like), to select from a plurality of states and a plurality of options within each state. The connecting element is connected to a voltage rail to set the desired state and select the current source that will supply current to the connecting element. Another object of this invention is to keep the circuitry within the integrated circuit simple and flexible.

In one aspect the invention relates to a method of selecting a state from a plurality of states using a program pin. The method includes connecting the program pin to one of a first current source and a second current source, in response to a first voltage applied to the program pin, to thereby generate a second voltage at the program pin, and selecting a state from the plurality of states in response to the first and second voltages. In another embodiment, the method includes applying the first voltage to the program pin. In another embodiment, the method includes determining whether the first voltage exceeds a first reference voltage. In another embodiment, the method includes connecting the program pin to the first current source if the first voltage does not exceed the first reference voltage, and connecting the program pin to the second current source if the first voltage exceeds the first reference voltage.

In another embodiment, the method includes determining if the second voltage exceeds a second reference voltage, and wherein the step of selecting further comprises selecting a state based on the first voltage and the determination of whether the second voltage exceeds the second reference voltage. In another embodiment, the method includes selecting from a group consisting of a state corresponding to a continuous mode and a p-channel high side switch, a state corresponding to a discontinuous mode and the p-channel high side switch, a state corresponding to the continuous mode and a n-channel high side switch, and a state corresponding to the discontinuous mode and the n-channel high side switch. In another embodiment, the method includes converting a switch control signal into a drive signal compatible with one of a p-channel field effect transistor and an n-channel field effect transistor in response to the selection of the state.

In another embodiment, the method includes maintaining a predefined safe mode of operation in response to the selection of the state resulting in operation outside a predefined criterion corresponding to a normal mode of operation. In another embodiment, the method includes controlling a switching regulator based at least in part on the selection of the state. In another embodiment, the switching regulator is a synchronous, DC to DC converter. In another embodiment, the first reference voltage is ground. In another embodiment, the first voltage is substantially equal to the second voltage.

In another aspect the invention relates to method of selecting a state from a plurality of states using a program pin in electrical communication, through a resistor element, to either the first rail or the second rail. The method includes determining from a first voltage at the program pin whether the resistor element is in electrical communication with one of the first rail and the second rail, connecting to one of a first current source and a second current source in response to the first voltage, to thereby generate a second voltage, and selecting one of the plurality of states in response to the first and the second voltages. In another embodiment, the method includes, upon determination that the resistor element is in electrical communication with the first rail, connecting a current sink to the program pin, and upon determination that the resistor element is in electrical communication with the second rail, connecting a current supply to the program pin. In another embodiment, the method includes determining a range of resistance of the connecting element in electrical communication with the program pin in response to the second voltage, the range between a first and a second threshold value, and wherein the step of selecting comprises selecting one of the plurality of states in response to the determined rail and the determined range of resistance.

In another aspect the invention relates to a system for selecting one of a plurality of operating states using a program pin. The system includes a first comparator, a current switch module and a logic module. The first comparator includes a first terminal in communication with the program pin, a second terminal adapted to receive a first reference voltage, and a third terminal, the first comparator generating a first indicator signal in response to a voltage applied at the program pin, the first indicator signal having a first state and a second state. The current switch module includes a first terminal in communication with the third terminal of the first comparator, and a second terminal in communication with the program pin, the current switch module providing a first current at the second terminal of the current switch module if the first indicator signal is in the first state, the current switch module receiving a second current at the second terminal of the current switch module if the first indicator signal is in the second state. The logic module includes a first terminal in communication with the second terminal of the current switch module, a second terminal adapted to receive a second reference voltage, and a third terminal, the logic module generating a second indicator signal in response to a voltage applied at the program pin.

In another embodiment, the current switch module includes a switch, a first current source and a second current source. The switch includes a first terminal, a second terminal, a control terminal and a third terminal, the control terminal in communication with the first terminal of the current switch module and the third terminal in communication with the second terminal of the current switch module. The first current source includes a first terminal adapted to receive a third reference voltage, and a second terminal in communication with the first terminal of the switch, the first current source providing the first current through the switch when the first indicator signal is in the first state. The second current source includes a first terminal adapted to receive a fourth reference voltage, and a second terminal in communication with the second terminal of the switch, the second current source receiving the second current through the switch. In another embodiment, the third reference voltage is a first rail and the fourth reference voltage is a second rail.

In another embodiment, the logic module further includes a fourth terminal, a fifth terminal, a second comparator, a third comparator, a first NOR gate, a second NOR gate and an OR gate. The fourth terminal is adapted to receive a third reference voltage. The fifth terminal is in communication with the third terminal of the first comparator. The second comparator includes a first terminal in communication with the first terminal of the logic module, a second terminal in communication with the second terminal of the logic module, and a third terminal. The third comparator includes a first terminal in communication with the first terminal of the logic module, a second terminal in communication with the fourth terminal of the logic module, and a third terminal. The first NOR gate includes a first terminal in communication with the third terminal of the second comparator, a second terminal in communication with the fifth terminal of the logic module, and a third terminal. The second NOR gate includes a first terminal in communication with the third terminal of the third comparator, an inverting terminal in communication with the fifth terminal of the logic module, and a third terminal. The OR gate includes a first terminal in communication with the third terminal of the first NOR gate, a second terminal in communication with the third terminal of the second NOR gate, and an third terminal in communication with the third terminal of the logic module.

In another embodiment, the system includes an inverter having a first terminal in communication with the third terminal of the first comparator, and a second terminal, the second terminal of the inverter providing a third indicator signal complementary to the first indicator signal. In another embodiment, the first indicator signal corresponds to a type of switch, the first state of the first indicator signal corresponds to a p-channel device and the second state of the first indicator signal corresponds to a n-channel device, the second indicator signal corresponds to a mode of operation and a first state of the second indicator signal corresponds to a continuous mode of operation and a second state of the second indicator signal corresponds to a discontinuous mode of operation. In another embodiment, the first and second currents are substantially constant.

In another aspect the invention relates to a method of selecting a state and an option within the selected state using a program pin. The method includes receiving a programming voltage at the program pin, selecting the state from a plurality of discrete states in response to a comparison between the programming voltage and a first reference voltage, and selecting the option from a plurality of options within the selected state, in response to a comparison between the programming voltage and a second reference voltage. The options can be continuous or discrete. In another embodiment, the method includes conducting current from the program pin in response to the programming voltage being greater than or equal to a third reference voltage, thereby generating a first modified programming voltage, and supplying current to the program pin in response to the programming voltage being less than the third reference voltage, thereby generating a modified programming voltage. In another embodiment, the method includes selecting the option from a plurality of continuous options within the selected state in response to a comparison of one of the first and the second modified programming voltages and the second reference voltage.

BRIEF DESCRIPTION OF THE DRAWINGS

Other objects, features and advantages will occur to those skilled in the art from the following description of a preferred embodiment and the accompanying drawings, in which.

DETAILED DESCRIPTION

Figure 1:
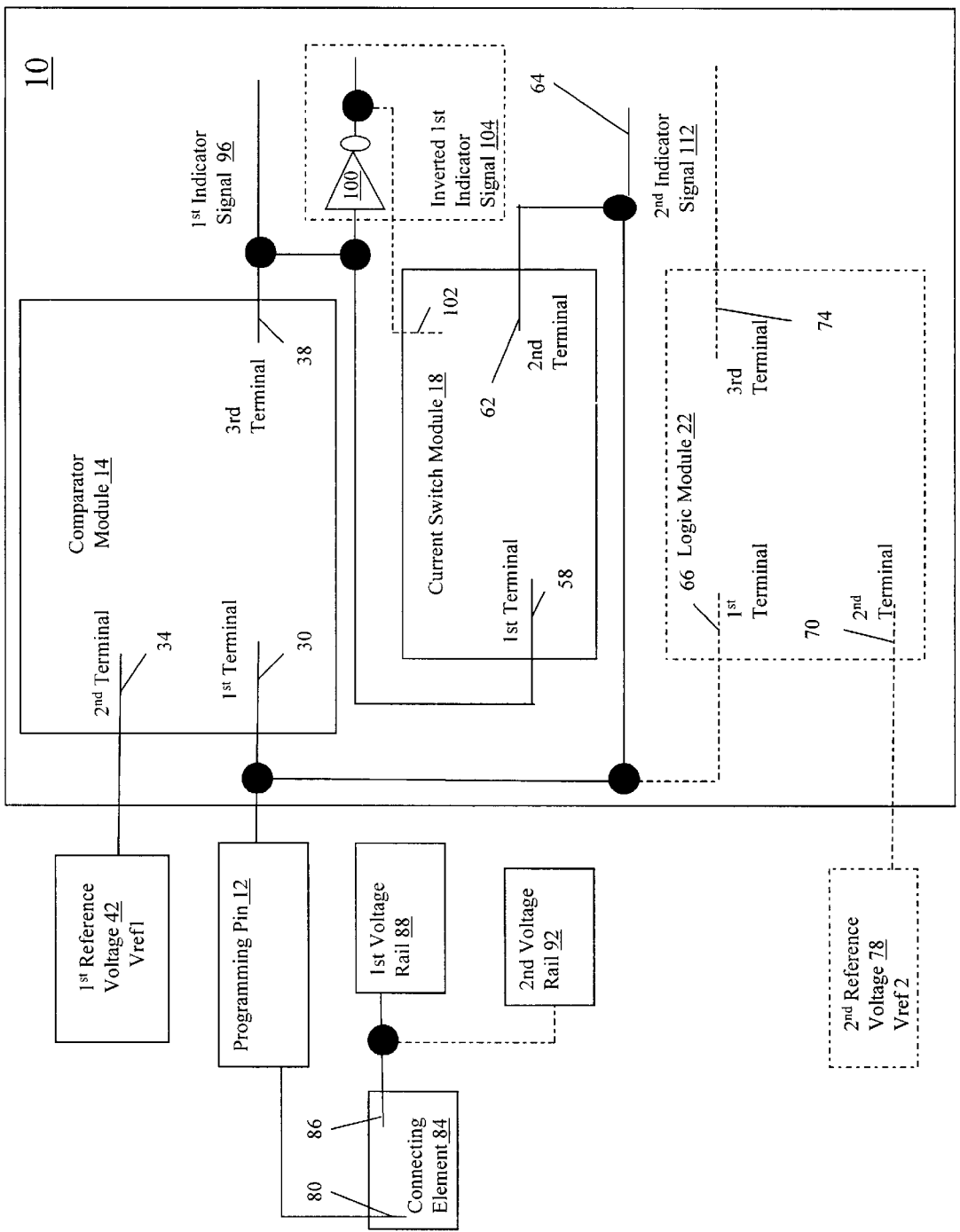
FIG. 1 is a high-level block diagram of one embodiment of the invention.

FIG. 1 depicts, at a high level, a system 10 for selecting a state and an option within the selected state using a single program pin 12. The system 10 includes a comparator module 14, a current switch module 18 and a logic module 22. The comparator module 14 includes a first terminal 30, a second terminal 34 and a third terminal 38. The first terminal 30 is in communication with the program pin 12. The second terminal 34 is in communication with a first voltage reference Vref1 42.

The current switch module 18 includes a first terminal 58 and a second terminal 62. The first terminal 58 is in communication with the third terminal 38 of the comparator module 14. The second terminal 62 is in communication with the program pin 12 and the first terminal 30 of the comparator module 14. The logic module 22 includes a first terminal 66, a second terminal 70 and a third terminal 74. The first terminal 66 is in communication with the program pin 12, the second terminal 62 of the current switch module 18 and the first terminal 30 of the comparator module 14. The second terminal 70 is in communication with a second voltage reference Vref2 78.

In operation, the user connects terminal 80 of a connecting element 84 (e.g., any element that allows current flow, such as a wire, a resistor or the like) to the program pin 12. The user connects terminal 86 of the connecting element 84 to a first voltage rail 88. Alternatively, the user can connect terminal 86 of the connecting element 84 to a second voltage rail 92. In one embodiment, the voltage rails 88 and 92 are approximately equal to the voltage rails used by the system 10, accounting for small trace resistance if applicable. At first, there is no current flow, so the voltage at the program pin 12 is equivalent to the voltage rail 88 or 92 to which the user connected the connecting element 84. The comparator module 14 receives the voltage applied to the program pin 12 at its first input terminal 30. The comparator module 14 compares the voltage at the first terminal 30 with the first reference voltage Vref1 42 applied to its second terminal 34. In response, the comparator module 14 outputs a first indicator signal 96 at its third terminal 38. For example, if the voltage at the first terminal 30 is less than or equal to the first reference voltage Vref1 42, the comparator module 14 generates the first indicator signal 96 in a first state (e.g., a logic high). If the voltage at the first terminal 30 is greater than the first reference voltage Vref1 42, the comparator module 14 generates the first indicator signal 96 in a second state (e.g., a logic low). The state of the first indicator signal 96 represents the state selected by the user, determined from the connection of the connecting element 84 to the selected one of a plurality of available voltage rails (e.g., the first voltage rail 88 and the second voltage rail 92). In one embodiment, the number of available voltage rails to which the user can connect represents the number of states the user can select.

FIG. 1 also shows an optional inverter 100 that inverts the first indicator signal 96 to generate an inverted first indicator signal 104. For example, if the first indicator signal 96 is in the first state, the optional inverter 100 generates the inverted first indicator signal 104 as a substantial equivalent to the first indicator signal 96 in its second state. If the first indicator signal 96 is in the second state, the optional inverter 100 generates the inverted first indicator signal 104 as a substantial equivalent to the first indicator signal 96 in its first state. In further embodiments, the current switch module 18 includes an optional terminal 102 to receive the inverted first indicator signal 104.

The current switch module 18 receives the first indicator signal 96 at the first input terminal 58. In response to the state of the received first indicator signal 96, the current switch module 18 connects its second terminal 62 to one of a plurality of current sources (not shown) within the current switch module 18. The current sources provide a controlled current. In one embodiment the controlled current is a fixed current. In other embodiments, the controlled current is a function of one or more parameters such as supply voltage, temperature and the like. The selected current source also establishes the direction of a controlled current flow through the second terminal 62. For example, if the first indicator signal 96 is in the first state, the current flows out of the second terminal 62 to the program pin 12. If the first indicator signal 96 is in the second state, the controlled current flows into of the second terminal 62 from the program pin 12. If an embodiment includes the optional terminal 102, the first indicator signal 96 at the first terminal 58 and the inverted first indicator signal 104 at the optional terminal 102 are both used to control current flow.

When the current switch module 18 connects the second terminal 62 to one of the current sources, the controlled current flows through the connecting element 84, resulting in a modified voltage at the program pin 12. The polarity of the modified voltage depends on the direction of the current flow (e.g., to or from the program pin 12) and the magnitude of the modified voltage depends on the value of resistance of the connecting element 84 and the value of the controlled current of the selected current source. If the resistance of the connecting element 84 is greater than zero, the modified voltage at the program pin 12 changes when the current switch module 18 connects the second terminal 62 to one of the current sources. If the resistance is zero, the value of the modified voltage remains the same as the value of the voltage at the program pin 12 prior to the current switch module 18 connecting the second terminal 62 to one of the current sources.

In one embodiment, the options within a selected state (e.g., state of the first indicator signal 96) are continuous, representing the full range of possible modified voltages at the program pin 12. In this embodiment, the modified voltage at the program pin 12 is a second indicator signal 112 shown at output terminal 64. Once the system 10 indicates a selected state with the first indicator signal 96, the options within that selected state vary with the modified voltage. The number of options corresponds to the range of possible modified voltages at the program pin 12. The range of modified voltages corresponds to the range of resistance values of the connecting element 84 and the available controlled currents of the current sources.

In another embodiment, the options within a selected state (e.g., state of the first indicator signal 96) are discrete. In this embodiment, the system 10 uses the optional logic module 22 to determine the discrete option selected. The logic module 22 receives the modified voltage at its first terminal 66. The logic module 22 compares the modified voltage with the second reference voltage Vref2 78 at its second terminal 70. In response, the logic module outputs the second indicator signal 112. For example, if the modified voltage at the first terminal 66 is less than or equal to the second reference voltage Vref2 78, the logic module 22 generates the second indicator signal 112 in a first state (e.g., a logic high). If the modified voltage at the first terminal 66 is greater than the second reference voltage Vref2 78, the logic module 22 generates the second indicator signal 112 in a second state (e.g., a logic low). The state of the second indicator signal 112 represents the discrete option selected by the user, determined from the value of the modified voltage at the first terminal 66. The modified voltage is representative of the value of resistance of the connecting element 84 and the value of the controlled current of the selected current source (e.g., the voltage drop across the connecting element 84). In a further embodiment, the logic module 22 compares the modified voltage applied to terminal 66 to additional reference voltages. The second indicator signal 112 can be in one of many possible states and is determined according to the results of multiple comparisons using the additional reference voltages.

Figure 2:
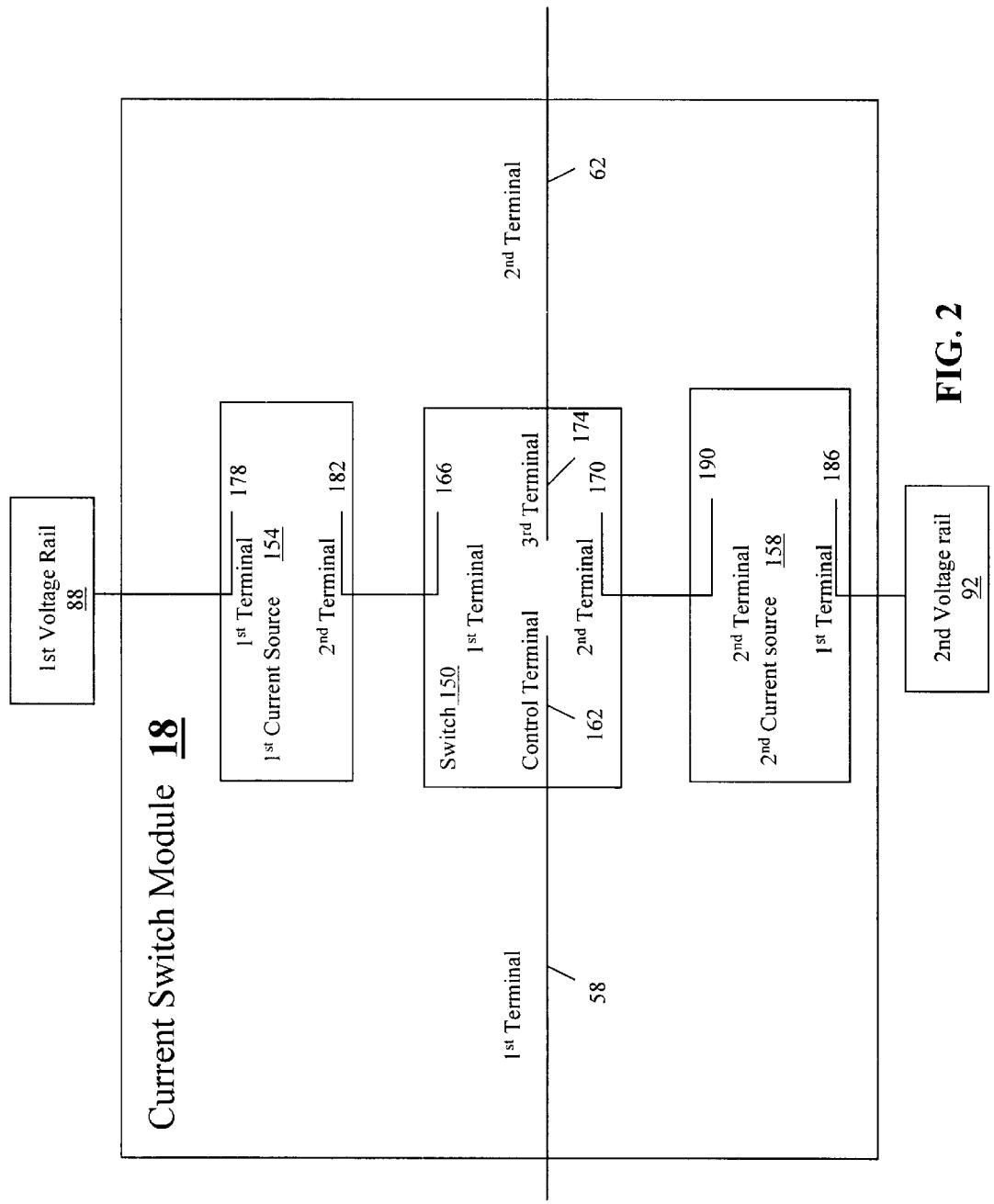
FIG. 2 is a detailed block diagram of one embodiment of the current switch module shown in FIG. 1.

FIG. 2 shows the current switch module 18 in more detail. The current switch module 18 includes a switch 150, a first current source 154 and a second current source 158. In other embodiments, the current switch module 18 includes more than two current sources. The switch 150 includes a control terminal 162, a first terminal 166, a second terminal 170 and a third terminal 174. The control terminal 162 of the switch 150 is the first terminal 58 of the current switch module 18. The third terminal 174 of the switch 150 is the second terminal 62 of the current switch module 18.

The first current source 154 includes a first terminal 178 and a second terminal 182. The first terminal 178 of the first current source 154 is in communication with the first voltage rail 88. The second terminal 182 of the first current source 154 is in communication with the first terminal 166 of the switch 150. The second current source 158 includes a first terminal 186 and a second terminal 190. The first terminal 186 of the second current source 158 is in communication with the second voltage rail 92. The second terminal 190 of the second current source 158 is in communication with the second terminal 170 of the switch 150.

In operation, the switch 150 receives the first indicator signal 96 at the control terminal 162. In response to the state of the first indicator signal 96, the switch 150 connects the third terminal 174 to either the first terminal 166 or the second terminal 170. For example, if the first indicator signal 96 is in a state that represents that the connecting element 84 is connected to the second voltage rail 92, the switch 150 connects the third terminal 174 to the first terminal 166. The first terminal 166 is in communication, through the first current source 154, with the first voltage rail 88. For this example, the first voltage rail 88 is at a higher potential than the second voltage rail 92. Thus, by connecting the third terminal 174 of the switch to the first terminal 166, and ultimately to the first voltage rail 88, the current flow is out of the second terminal 62 of the current switch module 18.

Conversely, if the first indicator signal 96 is in a state that represents that the connecting element 84 is connected to the first voltage rail 88, the switch 150 connects the third terminal 174 to the second terminal 170. The second terminal 170 is in communication, through the second current source 158, with the second voltage rail 92. Thus, by connecting the third terminal 174 of the switch to the second terminal 170, and ultimately to the second voltage rail 92, the current flow is into the second terminal 62 of the current switch module 18. In one embodiment, the first current source 154 and second current source 158 each provide a predetermined controlled current to the connecting element 84. Knowing the controlled current, a user selects the value of resistance of the connecting element 84 so that the resulting modified voltage corresponds to the desired option.

Although two voltage rails 88 and 92, two states of the first indicator signal 92, one reference voltage Vref1 42 and two input terminals 30 and 34 are used in the illustrative embodiment for ease of explanation, the invention is not limited to such an embodiment. In other embodiments, the user can connect terminal 86 of the connecting element to three or more voltage rails. In some of these embodiments, the comparator module 14 uses additional terminals and additional reference voltages. The comparator module 14 contains a configuration of comparators and logic gates, as known to one skilled in the art, to determine a voltage range within which the voltage applied at the program pin falls. Each voltage range corresponds to the voltage rail to which the connecting element 84 is connected. The first indicator signal 96 includes three or more states, or alternatively can be expanded into a digital word with a plurality of bits, representative of the available voltage rails and/or operating states from which the user can select. The first indicator signal 96 can be in one of these possible states and is determined according to the results of multiple comparisons using the additional reference voltages.

Figure 3:
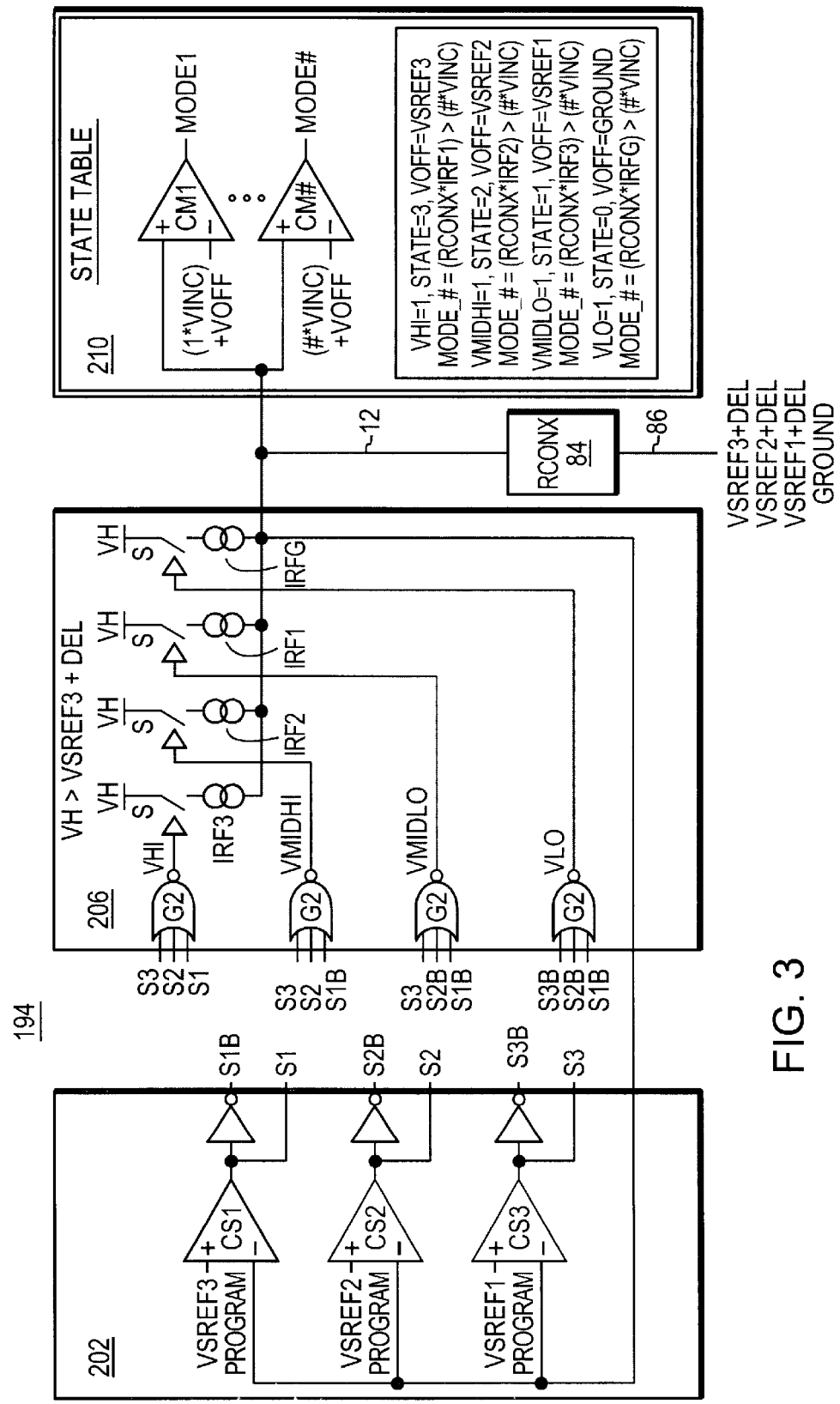
FIG. 3 is a detailed block diagram of one embodiment of the invention using four voltage rails and current sources.

FIG. 3 illustrates an embodiment of a system 194 for selecting a state and an option within that state where four voltage rails and four current sources are used. The system includes a comparator module 202, a current switch module 206 and a logic module 210. The user connects the terminal 86 of the connecting element 84 to one of the four available voltage rails (e.g., VSREF3+DEL, VSREF2+DEL, VSREF1+DEL AND GROUND). Before current flows through the connecting element 84, the comparators CS1, CS2, and CS3 of the comparator module 202 compare the voltage applied at the program pin 12 (e.g., VSREF3+DEL, VSREF2+DEL, VSREF1+DEL AND GROUND) with reference voltages VSREF3, VSREF2 and VSREF1, respectively. In response, the comparator module 202 generates a first indicator signal (e.g., S1, S1B, S2, S2B, S3 and S3B).

The current switch module 206 receives the first indicator signal (e.g., S1, S1B, S2, S2B, S3 and S3B) and, using logic gates G2 and switches S, connects one of the four current sources to the program pin 12. The connected current source supplies a controlled current (e.g., IRFG, IRF1, IRF2 or IRF3) to the program pin 12 and through the connecting element 84 to generate a modified voltage applied at the program pin 12. The logic module 210 determines the option selected by comparing the modified voltage at program pin 12 with additional reference voltages (e.g., (1*VINC)+VOFF, (#*VINC)+VOFF). In response, the logic module 210 generates a second indicator signal (e.g., MODE1 and MODE#).

Figure 4:
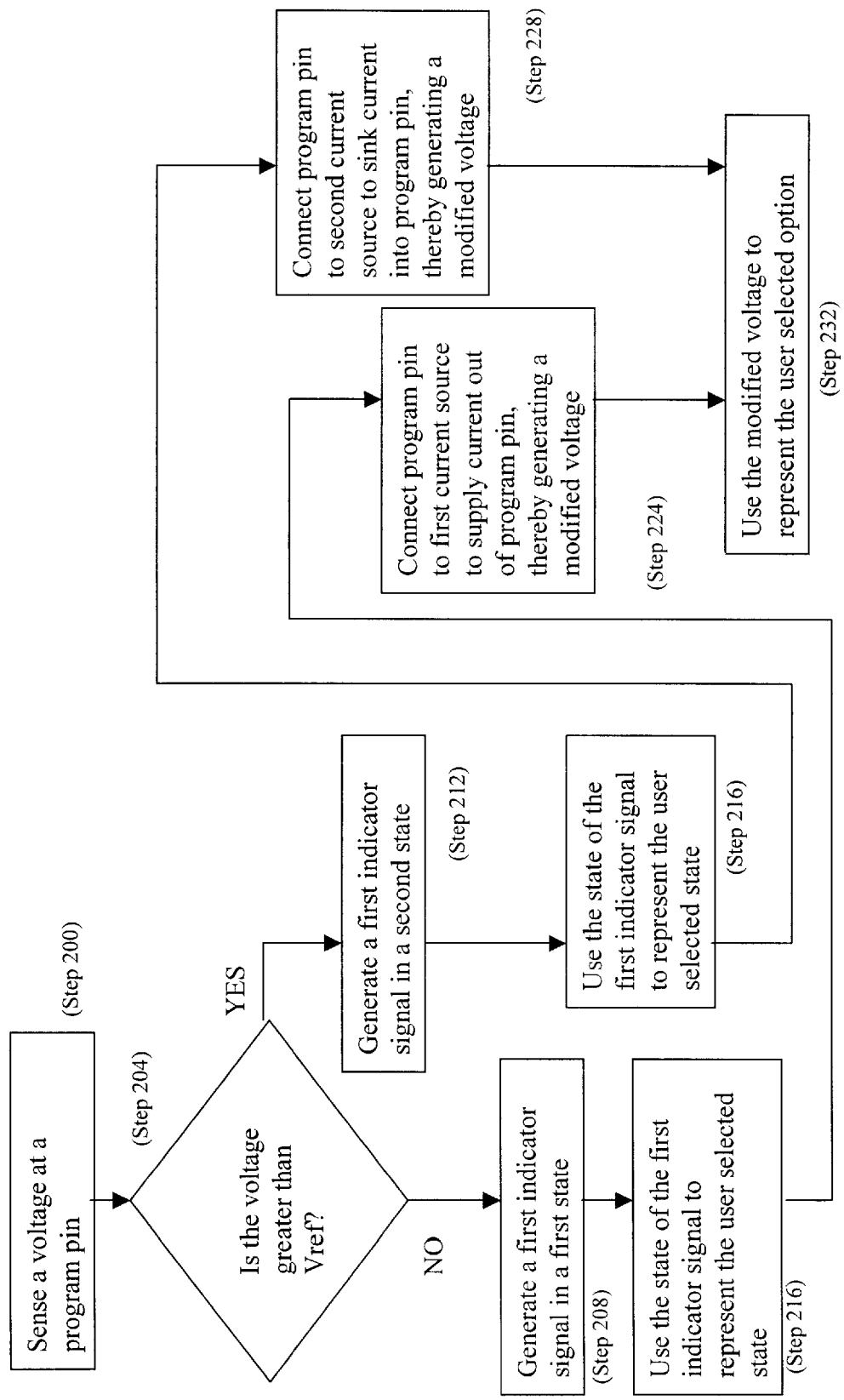
FIG. 4 is a high-level flow diagram of one embodiment of the invention.

FIG. 4 illustrates a flow diagram of one embodiment of the process for selecting a state and an option within that state. The system senses (step 200) a voltage applied to a program pin. The system determines (step 204), by comparing the voltage with a reference voltage Vref, whether the voltage is greater than Vref. If the result is "NO", the system generates (step 208) a first indicator signal in a first state. If the result is "YES", the system generates (step 212) a first indicator signal in a second state. The system uses (step 216) this state (e.g., first or second) of the first indicator signal to represent the user-selected state. For example, other circuitry connected to the system can use the state of the first indicator signal to place a device in one of multiple operational states.

If the result of the determination (step 204) is "NO", the system connects (step 224) the program pin to a first current source. This causes the current to flow from the current source into the program pin, thereby generating (step 224) a modified voltage. If the result of the determination (step 204) is "YES", the system connects (step 228) the program pin to a second current source. This causes the current to flow from the program pin into the current source, if thereby generating (step 228) a modified voltage. The system uses (step 232) this modified voltage to represent the user-selected option within the user-selected state. It is noteworthy that in some instances, the modified voltage is equivalent to the voltage sensed (step 200) at the program pin (e.g., an instance when the connecting element has substantially zero resistance).

Figure 5:
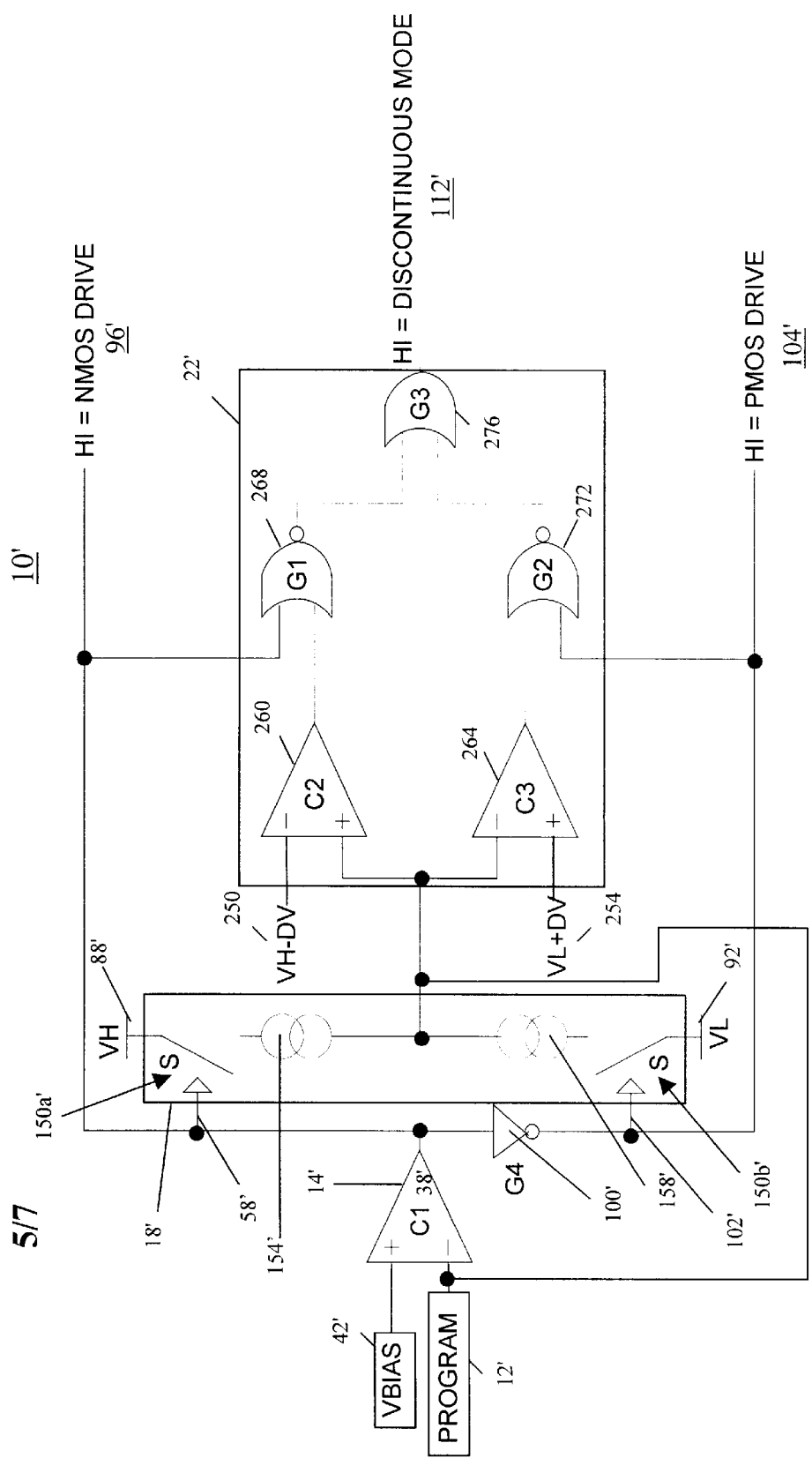
FIG. 5 is a high-level block diagram of another embodiment of the invention.

FIG. 5 illustrates another embodiment of a system 10' using a program pin 12' to select between a state in which a NMOS switching device is used and a state in which a PMOS switching device is used. Within both of these states are the same two options, a continuous mode and a discontinuous mode. The system 10' includes a first comparator 14', a current switch module 18', a logic module 22', a voltage reference VBIAS 42', a first voltage rail 88', a second voltage rail 92', a voltage reference VH−DV 250 and a voltage reference VL+DV 254.

The first comparator 14' includes a positive terminal, a negative terminal and an output terminal 38'. The positive terminal of the first comparator 14' is in communication with the voltage reference VBIAS 42'. The negative terminal of the first comparator 14' is in communication with the program pin 12'. The output terminal of the first comparator 14' is in communication with the first terminal 58' of the current switching module 18'. The signal at the output terminal 38' of the comparator 14' is a first indicator signal 96'. The comparator 14' compares the voltage applied at the positive terminal (i.e., the voltage reference VBIAS 42') with the voltage at the negative terminal. If the value of the voltage at positive terminal is greater, the comparator 14' generates the first indicator signal 96' in a first state (e.g., a logic high), otherwise, the comparator 14' generates the first indicator signal 96' in a second state (e.g., a logic low). The first indicator signal 96' indicates the state of operation. In the embodiment shown the first indicator signal 96' indicates the type of switching device (e.g., NMOS or PMOS), with the first state (e.g., a logic high) indicating an NMOS device and the second state (e.g., a logic low) indicating a PMOS device.

The current switch module 18' includes a first switch 150a', a second switch 150b', a first current source 154' and a second current source 158'. Also shown is an inverter 100', the output of which controls the second switch 150b'. The output of the inverter 100' is the inverted first indicator signal 104'. The first current source 154' is used to provide a controlled current flow and is in communication with the program pin 12'. However, no current flows through the first current source 154' until the first switch 150a' is closed (e.g., conductive), thus connecting the first voltage rail 88' to the first current source 154'. The state of the first indicator signal 96' controls the closing of the first switch 150a'. For example, if the first indicator signal 96' is in the first state (e.g., a logic high), the first switch 150a' is closed (e.g., conductive). If the first indicator signal 96' is in the second state (e.g., a logic low), the first switch 150a' is open (e.g., non-conductive).

Similarly, the second current source 158' is used to provide a controlled current flow and is in communication with the program pin 12'. However, no current flows through the second current source 158' until the second switch 150b' is closed (e.g., conductive), thus connecting the second voltage rail 92' to the second current source 158'. The state of the inverted first indicator signal 104' controls the closing of the second switch 150b'. For example, if the inverted first indicator signal 104' is in a first state (e.g., a logic low), equivalent to the inverted first state (e.g., a logic high) of the first indicator signal 96', the second switch 150b' is open (e.g., non-conductive). If the inverted first indicator signal 104' is in a second state (e.g., a logic high), equivalent to the inverted second state (e.g., a logic low) of the first indicator signal 96', the second switch 150b' is closed (e.g., conductive).

The logic module 22' includes a first comparator 260, a second comparator 264, a first logic gate 268, a second logic gate 272 and a third logic gate 276. The negative terminal of the first comparator 260 is in communication with the voltage reference VH−DV 250. The positive terminal of the first comparator 260 is in communication with the program pin 12'. The first comparator 260 compares the voltage at the positive terminal and the voltage at the negative terminal (i.e., the voltage reference VH−DV 250). If the value of the voltage at positive terminal is greater, the first comparator 260 generates a voltage in a first state (e.g., a logic high) at the output terminal of the first comparator 260. Otherwise, the first comparator 260 generates a voltage in a second state (e.g., a logic low). The first logic gate 268 receives the voltage generated by the first comparator 260 and the first indicator signal 96' generated by the comparator 14'. The first logic gate 268 performs a NOR function (i.e., logic high output if both inputs are logic low, otherwise logic low output) on the two received voltages and provides the result to the third logic gate 276.

Similarly, the positive terminal of the second comparator 264 is in communication with the voltage reference VL+DV 254. The negative terminal of the second comparator 264 is in communication with the program pin 12'. The second comparator 264 compares the voltage at the positive terminal (i.e., the voltage reference VL+DV 254) with the voltage at the negative terminal. If the value of the voltage at positive terminal is greater, the second comparator 264 generates a voltage in a first state (e.g., a logic high) at the output terminal of the second comparator 264. Otherwise, the second comparator 264 generates a voltage in a second state (e.g., a logic low). The second logic gate 272 receives the voltage generated by the second comparator 264 and the inverted first indicator signal 104' generated by the inverter 100'. The second logic gate 272 performs a NOR function (i.e., logic high output if both inputs are logic low, otherwise logic low output) on the two received voltages and provides the result to the third logic gate 276. The third logic gate receives the output voltages from the first logic gate 268 and the second logic gate 272. The third logic gate 276 performs an OR function (i.e., logic high output if either one of the inputs are logic high, otherwise logic low output) on the two received voltages and generates a second indicator signal 112'. The second indicator signal 112' indicates the options within the state of operation. In the embodiment shown the second indicator signal 112' indicates the mode of switching (e.g., continuous mode or discontinuous mode) within the selected state (e.g., NMOS or PMOS). The first state (e.g., a logic high) of the second indicator signal 112' illustrated indicates discontinuous mode and the second state (e.g., a logic low) indicate continuous mode.

Table 1 presents a logic truth table representative of the embodiment depicted in FIG. 5. Table 1 includes four exemplary connecting elements and connections. The first row of Table 1 depicts a connecting element with zero ohms of resistance connected from the program pin 12' to the second voltage rail 92'. The second row of Table 1 depicts a connecting element with sixty-eight Kohms of resistance connected from the program pin 12' to the second voltage rail 92'. The third row of Table 1 depicts a connecting element with zero ohms of resistance connected from the program pin 12' to the first voltage rail 88'. The fourth row of Table 1 depicts a connecting element with sixty-eight Kohms of resistance connected from the program pin 12' to the first voltage rail 88'. In Table 1, a "0" indicates a logic low state, a "1" indicates a logic high state and an "X" indicates a "don't care" situation where it doesn't matter what state the signal is in.

TABLE 1

| Connecting element | Output of comparator 14' (first indicator signal 96') | Output of inverter 100' (inverted first indicator signal 104') | Switch 150a' Status | Switch 150b' Status | Output of comparator 260 | Output of comparator 264 | Output of logic gate 268 | Output of logic gate 272 | Output of logic gate 276 (second indicator signal 112') |
|---|---|---|---|---|---|---|---|---|---|
| Zero ohms to second voltage rail 92' | 1 | 0 | closed | open | X | 1 | 0 | 0 | 0 |
| 68 Kohms to second voltage rail 92' | 1 | 0 | closed | open | X | 0 | 0 | 1 | 1 |
| Zero ohms to first voltage rail 88' | 0 | 1 | open | closed | 1 | X | 0 | 0 | 0 |
| 68 Kohms to first voltage rail 88' | 0 | 1 | open | closed | 0 | X | 1 | 0 | 1 |

Figure 6:
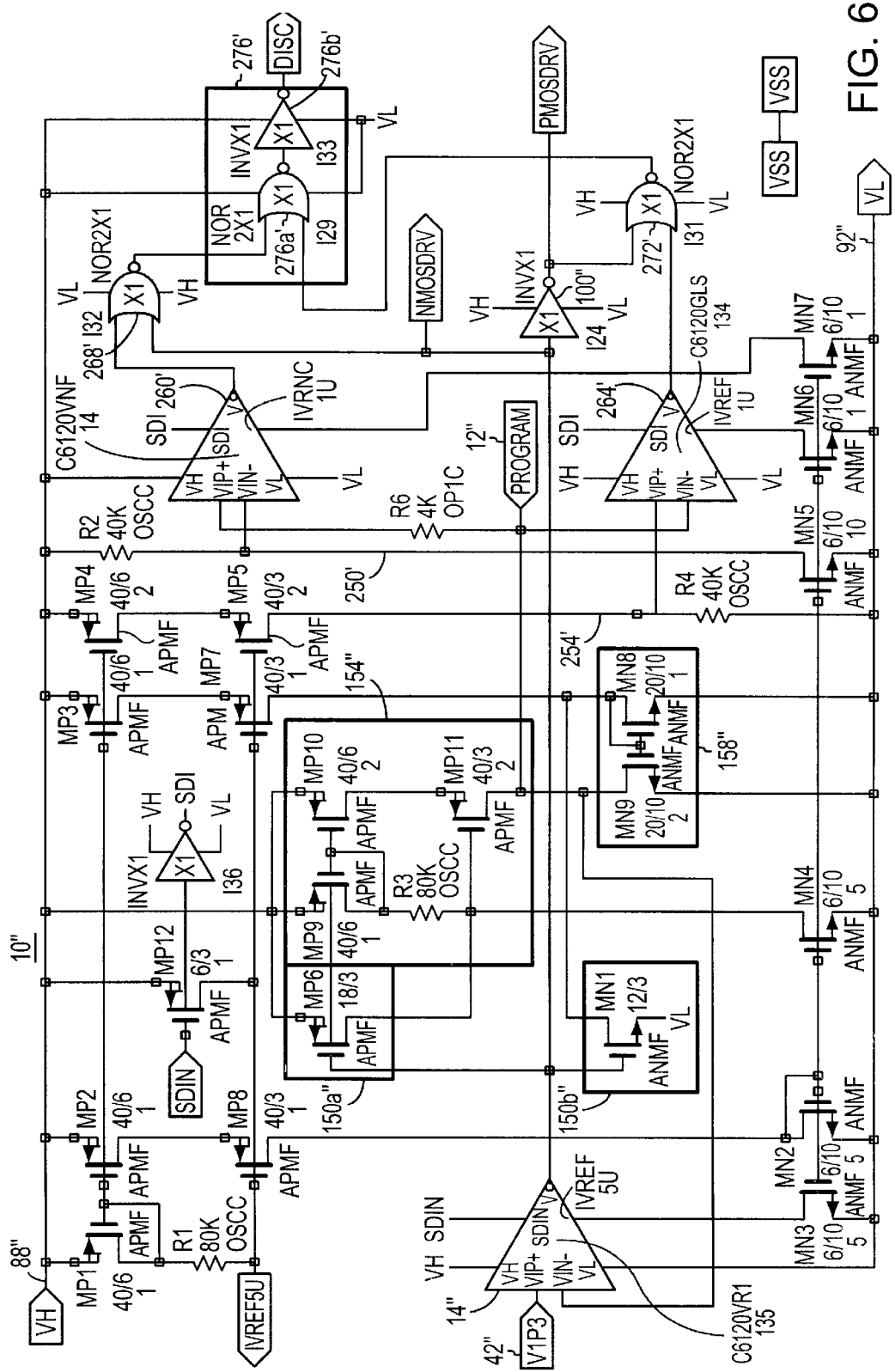
FIG. 6 is a circuit diagram of one embodiment of the invention.

FIG. 6 illustrates a circuit implementation of another embodiment of a system 10" for selecting a state and an option within the selected state using a single program pin 12". The system 10" includes a first comparator 14", a second comparator 260', a third comparator 264', a first switch 150a", a second switch 150b", a first current source 154", a second current source 158". The system 10" also includes an inverter 100", a first logic gate 268', a second logic gate 272', and a third logic gate 276'. The system 10" also includes a first voltage reference 42" at the positive terminal of comparator 14", a second voltage reference 250' at the negative terminal of comparator 260' and a third voltage reference 254' at the positive terminal of comparator 264'. The system 10" also includes a first voltage rail 88" and a second voltage rail 92".

The input terminals of the first comparator 14" receive the reference voltage 42" and a voltage applied at the program pin 12". The first comparator 14" compares the reference voltage 42" and the voltage applied at the program pin 12". If the value of the voltage at the positive terminal (e.g., the reference voltage 42") is greater, the first comparator 14" generates an output voltage in a first state (e.g., a logic high). Otherwise, the first comparator 14' generates the output voltage in a second state (e.g., a logic low). The system 10" uses the output voltage of the first comparator 14" to represent the user-selected state.

The system 10" also uses the output voltage of the first comparator 14" to control the first switch 150a" and the second switch 150b". The first switch 150a" is a p-channel MOSFET device MP6 in communication with the first voltage rail 88". The output terminal of the first comparator 14" is connected to the gate on the p-channel MOSFET device 150a" to control current flow through the p-channel MOSFET device 150a". The second switch 150b" is an n-channel MOSFET device MN1 in communication with the second voltage rail 92". The output terminal of the first comparator 14" is connected directly to the gate on the n-channel MOSFET device 150b" to control current flow through the n-channel MOSFET device 150b".

The first switch 150a" and the second switch 150b" activate the current flow from the first current source 154" and the second current source 158", respectively. The first current source 154" includes three p-channel MOSFET devices MP9, MP10, MP11 and an eighty Kohm resistor R3. When current flows through the first switch 150a" MP6, the gate of the directly connected p-channel device MP11 of the first current source 154" is brought to approximately the first voltage rail 88" and p-channel device MP11 does not conduct current. The eighty Kohm resistor R3 of the first current source 154" ensures that when the first switch 150a" opens (i.e., circuit reference MP6 stops conducting current), the gate of the directly connected p-channel device MP11 of the first current source 154" is brought to an appropriate level such that p-channel device MP11 conducts current.

When the first current source 154" is conducting current, the program pin 12" is coupled to the first voltage rail 88" through the first current source 154". As described above, this condition occurs (i.e., the first switch 150a" opened and the first current source 154" conducting current), for example, when the program pin 12" is coupled, through a connecting element (not shown) to the second voltage rail 92". Thus, the current flows from the first voltage rail 88", through the first current source 154" and out of the program pin 12" through the connecting element to the second voltage rail 92". In another embodiment, this condition can occur when the connecting element is connected to a third voltage rail, not shown, that is of a lower magnitude than the first voltage rail 88". The third voltage rail is not used by the system 10".

The second current source 158" includes two n-channel MOSFET devices MN8, MN9. When current flows through the second switch 150b" MN1, the gates of the directly connected n-channel devices MN8, MN9 of the second current source 158" are brought to approximately the second voltage rail 92". With the gates at the second voltage rail 92", the n-channel devices MN8, MN9 do not conduct current. When current is not flowing through the second switch 150b" MN1, the gates of the directly connected n-channel devices MN8, MN9 of the second current source 158" are brought to an appropriate level such that the n-channel devices MN8, MN9 conduct current.

When the second current source 158" is conducting current, the program pin 12" is coupled to the second voltage rail 92" through the second current source 158". As described above, this condition occurs (i.e., the second switch 150b" open and the second current source 158" conducting current), for example, when the program pin 12" is coupled, through the connecting element to the first voltage rail 88". Thus, the current flows from the first voltage rail 88", through the connecting element, into the program pin 12" and from the program pin 12" through the second current source 158" to the second voltage rail 92".

When either the first current source 154" or the second current source 158" starts conducting, current flows through the connecting element connected to the program pin 12". This current flow causes a voltage drop across the connecting element and thus the value of the voltage at the program pin 12" changes to a modified voltage, accounting for the voltage drop across the connecting element. Note that in one embodiment in which the connecting element is zero ohms, the modified voltage is the same as the voltage at the program pin 12" before current starts flowing. The system 10" applies the modified voltage at the program pin 12" to the positive terminal of the second comparator 260'. In the embodiment shown, the system 10" applies the modified voltage using a four Kohm resistor R6. This resistor R6 is used for electrostatic discharge (ESD) protection. The second comparator 260' receives a voltage reference VH−DV 250' at its negative terminal. In the embodiment shown, the system 10" creates the voltage reference VH−DV 250' using a forty Kohm resistor R2.

The second comparator 260' compares the modified voltage to the voltage reference VH−DV 250'. If the modified voltage is greater than or equal to the voltage reference VH−DV 250', the second comparator 260' provides a signal in a first state (e.g., a logic high). If the modified voltage is less than the voltage reference VH-DV 250', the second comparator 260' provides a signal in a second state (e.g., a logic low). The second comparator 260' provides its signal to the first logic gate 268'. The first logic gate 268' also receives the output voltage from the first comparator 14". The first logic gate 268' performs a NOR function (i.e., logic high output if both inputs are logic low, otherwise logic low output) on the two input voltages and provides its output voltage to the third logic gate 276'.

The system 10" also applies the modified voltage at the program pin 12" to the negative terminal of the third comparator 264'. The third comparator 264' receives a voltage reference VL+DV 254' at its positive terminal. In the embodiment shown, the system 10" creates the voltage reference VL+DV 254' using a forty Kohm resistor R4. The third comparator 264' compares the modified voltage to the voltage reference VL+DV 254'. If the modified voltage is less than the voltage reference VL+DV 254', the third comparator 264' provides a voltage in a first state (e.g., a logic high). If the modified voltage is greater than or equal to the voltage reference VL+DV 254', the third comparator 264' provides a voltage in a second state (e.g., a logic low). The third comparator 264' provides its output voltage to the second logic gate 272'. In addition to the output voltage of the third comparator 264', the second logic gate 272' also receives the inverted output voltage from the first comparator 14" through inverter 100". The second logic gate 272' performs a NOR function (i.e., logic high output if both inputs are logic low, otherwise logic low output) on its two received input voltages and provides an output voltage to the third logic gate 276'.

The third logic gate 276' includes a NOR gate 276a' and an inverter 276b'. The NOR gate 276a' receives the output voltages of the first logic gate 268' and the second logic gate 272'. The NOR gate 276a' performs a NOR function (i.e., logic high output if both inputs are logic low, otherwise logic low output) on its two input voltages and provides an output voltage to the inverter 276b'. The inverter 276b' provides the inverted state of the received voltage. The system 10" uses the output voltage of the inverter 276b' to represent the user-selected option within the user-selected state.

Figure 7:
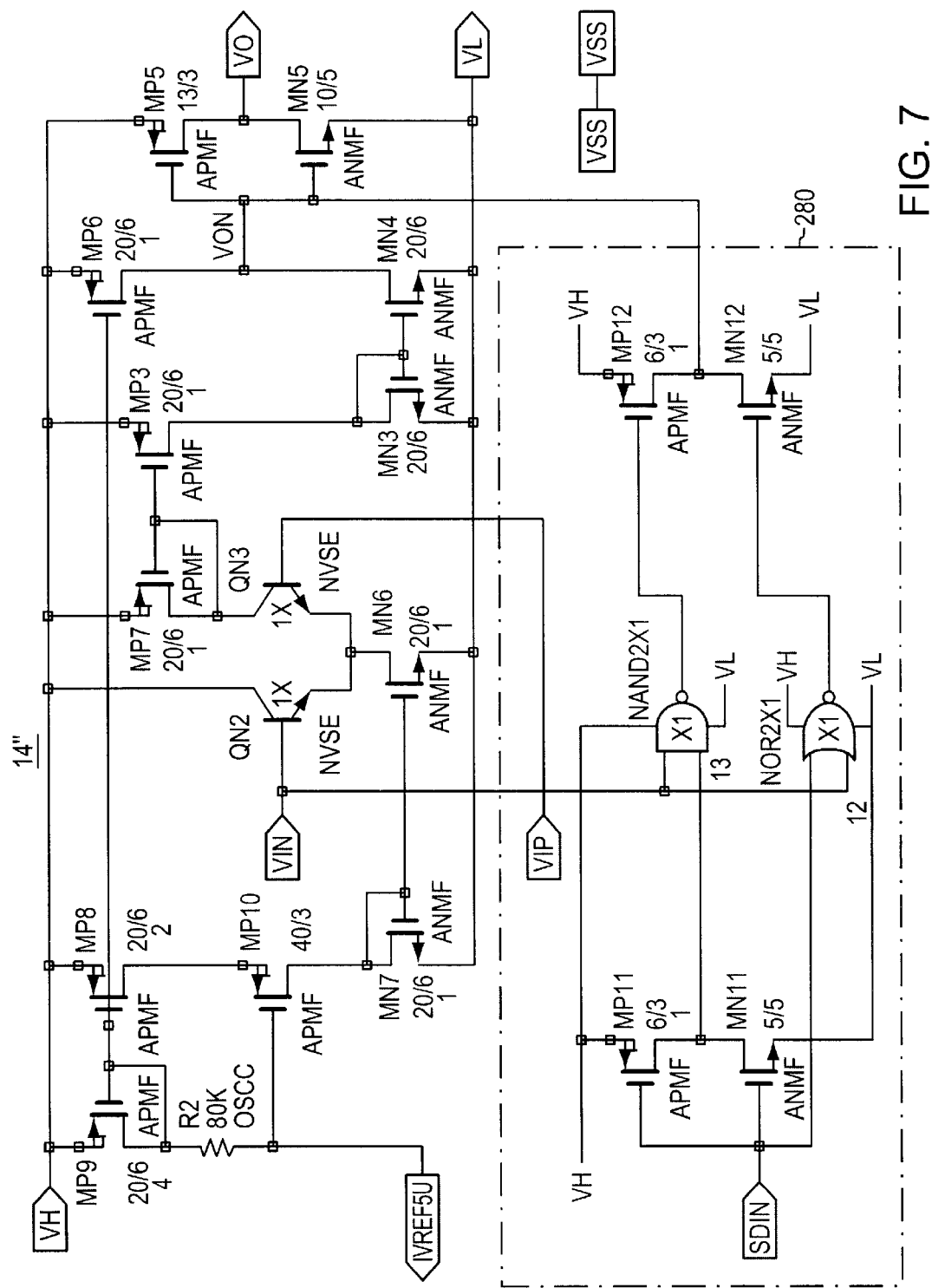
FIG. 7 is a circuit diagram of one embodiment of the safety module.

FIG. 7 illustrates an embodiment of the first comparator 14" in more detail. This embodiment includes a safety circuit 280 that the system 10" uses to ensure that the system 10" operates in a predetermined safe mode regardless of the user-selected state and the user-selected option within the user-selected state. The system 10" includes a safety circuit 280 to protect the Programming function during power supply shutdown, power-up, or fault modes. One skilled in the art can see that other implementations are equally usable for this purpose and circuit 280 is shown as one illustrative embodiment.

The invention may be embodied in other specific forms without departing from the spirit or essential characteristics thereof. For example, all polarities of logic and voltage signals are shown only for the illustrative functional embodiment. One skilled in the art can easily choose different polarities and arrange the specific components and logic accordingly for other configurations. The foregoing embodiments are therefore to be considered in all respects illustrative rather than limiting on the invention described herein. Scope of the invention is thus indicated by the appended claims rather than by the foregoing description, and all changes which come within the meaning and range of equivalency of the claims are therefore intended to be embraced therein.

What is claimed is:

1. A method of selecting a state from a plurality of states using a program pin, the method comprising:

connecting the program pin to one of a first current source and a second current source in response to a first voltage applied to the program pin, to thereby generate a second voltage at the program pin;

selecting a state from the plurality of states in response to the first and second voltages;

determining whether the first voltage exceeds a first reference voltage;

connecting the program pin to the first current source if the first voltage does not exceed the first reference voltage; and connecting the program pin to the second current source if the first voltage exceeds the first reference voltage.

2. A method of selecting a state from a plurality of states using a program pin, the method comprising:

connecting the program pin to one of a first current source and a second current source in response to a first voltage applied to the program pin, to thereby generate a second voltage at the program pin;

selecting a state from the plurality of states in response to the first and second voltages;

determining if the second voltage exceeds a second reference voltage; and wherein the step of selecting further comprises selecting a state based on the first voltage and the determination of whether the second voltage exceeds the second reference voltage.

3. A method of selecting a state from a plurality of states using a program pin, the method comprising:

connecting the program pin to one of a first current source and a second current source in response to a first voltage applied to the program pin, to thereby generate a second voltage at the program pin; and selecting a state from the plurality of states in response to the first and second voltages, wherein the step of selecting a state further comprises selecting from a group consisting of a state corresponding to a continuous mode and a p-channel high side switch, a state corresponding to a discontinuous mode and the p-channel high side switch, a state corresponding to the continuous mode and a n-channel high side switch, and a state corresponding to the discontinuous mode and the n-channel high side switch.

4. A method of selecting a state from a plurality of states using a program pin, the method comprising:

connecting the program pin to one of a first current source and a second current source in response to a first voltage applied to the program pin, to thereby generate a second voltage at the program pin;

selecting a state from the plurality of states in response to the first and second voltages; and converting a switch control signal into a drive signal compatible with one of a p-channel field effect transistor and an n-channel field effect transistor in response to the selection of the state.

5. A method of selecting a state from a plurality of states using a program pin, the method comprising:

connecting the program pin to one of a first current source and a second current source in response to a first voltage applied to the program pin, to thereby generate a second voltage at the program pin;

selecting a state from the plurality of states in response to the first and second voltages; and maintaining a predefined safe mode of operation in response to the selection of the state resulting in operation outside a predefined criterion corresponding to a normal mode of operation.

6. A method of selecting a state from a plurality of states using a program pin, the method comprising:

connecting the program pin to one of a first current source and a second current source in response to a first voltage applied to the program pin, to thereby generate a second voltage at the program pin;

selecting a state from the plurality of states in response to the first and second voltages; and controlling a switching regulator based at least in part on the selection of the state.

7. The method of claim 6 wherein the switching regulator is a synchronous, DC to DC converter.

8. A method of selecting a state from a plurality of states using a program pin, the method comprising:

connecting the program pin to one of a first current source and a second current source in response to a first voltage applied to the program pin, to thereby generate a second voltage at the program pin; and selecting a state from the plurality of states in response to the first and second voltages, wherein the first voltage is substantially equal to the second voltage.

9. A method of selecting a state from a plurality of states using a program pin in electrical communication, through a resistor element, to either a first rail or a second rail, the method comprising:

determining from a first voltage at the program pin whether the resistor element is in electrical communication with one of the first rail and the second rail;

connecting to one of a first current source and a second current source in response to the first voltage, to thereby generate a second voltage;

selecting one of the plurality of states in response to the first and the second voltages;

upon determination that the resistor element is in electrical communication with the first rail, connecting a current sink to the program pin; and upon determination that the resistor element is in electrical communication with the second rail, connecting a current supply to the program pin.

10. A method of selecting a state from a plurality of states using a program pin in electrical communication, through a resistor element, to either a first rail or a second rail, the method comprising:

determining from a first voltage at the program pin whether the resistor element is in electrical communication with one of the first rail and the second rail;

connecting to one of a first current source and a second current source in response to the first voltage, to thereby generate a second voltage;

selecting one of the plurality of states in response to the first and the second voltages;

determining a range of resistance of the connecting element in electrical communication with the program pin in response to the second voltage, the range between a first and a second threshold value; and wherein the step of selecting comprises selecting one of the plurality of the states in response to the determined rail and the determined range of resistance.

11. A system for selecting one of a plurality of operating states using a program pin, the system comprising:

a first comparator having a first terminal in communication with the program pin, a second terminal adapted to receive a first reference voltage, and a third terminal, the first comparator generating a first indicator signal in response to a voltage applied at the program pin, the first indicator signal having a first state and a second state;

a current switch module comprising a first terminal in communication with the third terminal of the first comparator, and a second terminal in communication with the program pin, the current switch module providing a first current at the second terminal of the current switch module if the first indicator signal is in the first state, the current switch module receiving a second current at the second terminal of the current switch module if the first indicator signal is in the second state, the current switch module generating a modified voltage at the program pin.

12. The system of claim 11 wherein the current switch module further comprises:

a switch having a first terminal, a second terminal, a control terminal and a third terminal, the control terminal in communication with the first terminal of the current switch module and the third terminal in communication with the second terminal of the current switch module;

a first current source having a first terminal adapted to receive a third reference voltage, and a second terminal in communication with the first terminal of the switch, the first current source providing the first current through the switch when the first indicator signal is in the first state; and a second current source having a first terminal adapted to receive a fourth reference voltage, and a second terminal in communication with the second terminal of the switch, the second current source receiving the second current through the switch.

13. The system of claim 12 wherein the third reference voltage is a first rail and the fourth reference voltage is a second rail.

14. The system of claim 11 further comprising:
a logic module having a first terminal in communication with the second terminal of the current switch module, a second terminal adapted to receive a second reference voltage, and a third terminal, the logic module generating at the third terminal a second indicator signal in response to the modified voltage applied at the program pin.

15. The system of claim 14 wherein the logic module further comprises:
a fourth terminal adapted to receive a third reference voltage;
a fifth terminal in communication with the third terminal of the first comparator;
a second comparator having a first terminal in communication with the first terminal of the logic module, a second terminal in communication with the second terminal of the logic module, and a third terminal;
a third comparator having a first terminal in communication with the first terminal of the logic module, a second terminal in communication with the fourth terminal of the logic module, and a third terminal;
a first NOR gate having a first terminal in communication with the third terminal of the second comparator, a second terminal in communication with the fifth terminal of the logic module, and a third terminal;
a second NOR gate having a first terminal in communication with the third terminal of the third comparator, an inverting terminal in communication with the fifth terminal of the logic module, and a third terminal; and
an OR gate having a first terminal in communication with the third terminal of the first NOR gate, a second terminal in communication with the third terminal of the second NOR gate, and an third terminal in communication with the third terminal of the logic module.

16. The system of claim 11 further comprising an inverter having a first terminal in communication with the third terminal of the first comparator, and a second terminal, the second terminal of the inverter providing a third indicator signal complementary to the first indicator signal.

17. The system of claim 11 wherein the first indicator signal corresponds to a type of switch, the first state of the first indicator signal corresponds to a p-channel device and the second state of the first indicator signal corresponds to a n-channel device, the second indicator signal corresponds to a mode of operation and a first state of the second indicator signal corresponds to a continuous mode of operation and a second state of the second indicator signal corresponds to a discontinuous mode of operation.

18. The system of claim 11 wherein the first and second currents are substantially constant.

19. A system for selecting a state using a program pin, the system comprising:
a means for connecting the program pin to one of a first current source and a second current source in response to a first voltage applied to the program pin, to thereby generate a second voltage at the program pin;
a means for selecting a state in response to the first and second voltages;
a means for determining whether the first voltage exceeds a first reference voltage;
a means for connecting the program pin to the first current source if the first voltage does not exceed the first reference voltage; and
a means for connecting the program pin to the second current source if the first voltage exceeds the first reference voltage.

20. A system for selecting a state using a program pin, the system comprising:
a means for connecting the program pin to one of a first current source and a second current source in response to a first voltage applied to the program pin, to thereby generate a second voltage at the program pin;
a means for selecting a state in response to the first and second voltages;
a means for determining if the second voltage exceeds a second reference voltage; and
wherein the means for selecting further comprises a means for selecting a state based on the first voltage and the determination of whether the second voltage exceeds the second reference voltage.

21. A system for selecting a state using a program pin, the system comprising:
a means for connecting the program pin to one of a first current source and a second current source in response to a first voltage applied to the program pin, to thereby generate a second voltage at the program pin; and
a means for selecting a state in response to the first and second voltages wherein the means for selecting a state further comprises a means for selecting from a group consisting of a state corresponding to a continuous mode and a p-channel high side switch, a state corresponding to a discontinuous mode and the p-channel high side switch, a state corresponding to the continuous mode and a n-channel high side switch, and a state corresponding to the discontinuous mode and the n-channel high side switch.

22. A system for selecting a state using a program pin, the system comprising:
a means for connecting the program pin to one of a first current source and a second current source in response to a first voltage applied to the program pin, to thereby generate a second voltage at the program pin;
a means for selecting a state in response to the first and second voltages; and
a means for converting a switch control signal into a drive signal compatible with one of a p-channel field effect transistor and an n-channel field effect transistor in response to the means for selecting the state.

23. A system for selecting a state using a program pin, the system comprising:
a means for connecting the program pin to one of a first current source and a second current source in response to a first voltage applied to the program pin, to thereby generate a second voltage at the program pin;
a means for selecting a state in response to the first and second voltages; and
a means for maintaining a predefined safe mode of operation in response to the selection of the state resulting in operation outside a predefined criterion corresponding to a normal mode operation.

24. A system for selecting a state using a program pin, the system comprising:
a means for connecting the program pin to one of a first current source and a second current source in response to a first voltage applied to the program pin, to thereby generate a second voltage at the program pin;
a means for selecting a state in response to the first and second voltages; and a means for controlling a switching regulator based at least in part on the selection of the state.

25. The system of claim 24 wherein the switching regulator is a synchronous, DC to DC converter.

26. A system for selecting a state using a program pin, the system comprising:

a means for connecting the program pin to one of a first current source and a second current source in response to a first voltage applied to the program pin, to thereby generate a second voltage at the program pin; and a means for selecting a state in response to the first and second voltages wherein the first voltage is substantially equal to the second voltage.

27. A method of selecting a state and an option within the selected state using a program pin, the method comprising:

receiving a programming voltage at the program pin;

selecting the state from a plurality of discrete states in response to a comparison between the programming voltage and a first reference voltage;

controlling current flow through the program pin in response to the programming voltage, thereby generating a modified voltage; and selecting the option from a plurality of options within the selected state in response to the modified voltage.

28. The method of claim 27 wherein the step of controlling current flow comprises:

conducting current from the program pin in response to the programming voltage being greater than or equal to a third reference voltage, thereby generating a first modified programming voltage; and supplying current to the program pin in response to the programming voltage being less than the third reference voltage, thereby generating a modified programming voltage.

29. The method of claim 28 wherein the step of selecting the option comprises selecting the option from a plurality of continuous options within the selected state in response to a comparison of one of the first and the second modified programming voltages and the second reference voltage.

30. The method of claim 27 wherein the step of controlling current flow comprises providing a controlled current at the program pin in response to the selected state, thereby generating a modified programming voltage.

* * * * *

UNITED STATES PATENT AND TRADEMARK OFFICE
CERTIFICATE OF CORRECTION

PATENT NO.   : 6,566,905 B2
DATED        : May 20, 2003
INVENTOR(S)  : Sanzo et al.

It is certified that error appears in the above-identified patent and that said Letters Patent is hereby corrected as shown below:

<u>Title page,</u>
The following Firm should be identified:
Testa, Hurwitz & Thibeault, LLP

<u>Column 17,</u>
Line 37, replace "an" with -- a --.

<u>Column 18,</u>
Line 59, immediately after "mode" insert -- of --.

Signed and Sealed this

Thirtieth Day of September, 2003

JAMES E. ROGAN
*Director of the United States Patent and Trademark Office*